US010935883B2

(12) United States Patent
Tavakkoli Kermani Ghariehali et al.

(10) Patent No.: US 10,935,883 B2
(45) Date of Patent: Mar. 2, 2021

(54) NANOIMPRINT TEMPLATE WITH LIGHT BLOCKING MATERIAL AND METHOD OF FABRICATION

(71) Applicant: CANON KABUSHIKI KAISHA, Tokyo (JP)

(72) Inventors: Amir Tavakkoli Kermani Ghariehali, Austin, TX (US); Edward Brian Fletcher, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 302 days.

(21) Appl. No.: 15/720,308

(22) Filed: Sep. 29, 2017

(65) Prior Publication Data

US 2019/0101822 A1 Apr. 4, 2019

(51) Int. Cl.
| | | |
|---|---|---|
| G03F 7/00 | (2006.01) |
| B29C 39/04 | (2006.01) |
| B29C 39/26 | (2006.01) |
| B29C 33/38 | (2006.01) |
| H01L 21/027 | (2006.01) |
| B29L 31/34 | (2006.01) |

(52) U.S. Cl.
CPC ........ G03F 7/0002 (2013.01); B29C 33/3842 (2013.01); B29C 39/04 (2013.01); B29C 39/26 (2013.01); H01L 21/0271 (2013.01); B29K 2905/08 (2013.01); B29K 2909/00 (2013.01); B29K 2995/0025 (2013.01); B29L 2031/3406 (2013.01)

(58) Field of Classification Search
CPC ... G03F 7/0002; B29C 33/3842; B29C 39/04; B29C 39/26; H01L 21/0271
See application file for complete search history.

(56) References Cited

U.S. PATENT DOCUMENTS

| | | | |
|---|---|---|---|
| 6,873,087 B1 | 3/2005 | Choi et al. |
| 6,932,934 B2 | 8/2005 | Choi et al. |
| 6,936,194 B2 | 8/2005 | Watts |
| 7,077,992 B2 | 7/2006 | Sreenivasan et al. |
| 7,157,036 B2 | 1/2007 | Choi et al. |
| 7,179,396 B2 | 2/2007 | Sreenivasan |
| 7,396,475 B2 | 7/2008 | Sreenivasan |
| 8,011,916 B2 | 9/2011 | Suehira et al. |
| 8,066,930 B2 | 11/2011 | Sreenivasan et al. |
| 8,076,386 B2 | 12/2011 | Xu et al. |
| 8,349,241 B2 | 1/2013 | Sreenivasan et al. |

(Continued)

FOREIGN PATENT DOCUMENTS

JP 2018014483 A * 1/2018

OTHER PUBLICATIONS

Machine Translation JP2018014483 (Year: 2018).*

*Primary Examiner* — Matthew J Daniels
*Assistant Examiner* — Wayne K. Swier
(74) *Attorney, Agent, or Firm* — Cameron A. King

(57) ABSTRACT

A nanoimprint lithography template, method of fabrication, and method of manufacturing an article using the same. The template includes a body having first and second opposed sides, the second side having a mesa extending therefrom, with the mesa having sidewalls and a surface. A recessed shelf extends around a perimeter of the mesa surface, with a light-blocking material positioned on at least the recessed shelf and at a thickness such that the light-blocking material does not extend beyond a plane defined by the mesa surface.

11 Claims, 7 Drawing Sheets

(56) References Cited

U.S. PATENT DOCUMENTS

| | | | |
|---|---|---|---|
| 2006/0266916 A1 | 11/2006 | Miller et al. | |
| 2007/0054097 A1* | 3/2007 | Suehira | B82Y 10/00 |
| | | | 428/195.1 |
| 2008/0303187 A1 | 12/2008 | Stacey et al. | |
| 2010/0264113 A1* | 10/2010 | Yoneda | B82Y 40/00 |
| | | | 216/41 |
| 2015/0306792 A1* | 10/2015 | Miyazawa | B29C 35/0888 |
| | | | 264/496 |
| 2016/0247673 A1* | 8/2016 | Tsuji | C23F 1/16 |
| 2017/0040161 A1* | 2/2017 | Sato | G03F 7/0002 |
| 2018/0059537 A1* | 3/2018 | Jung | G03F 7/0002 |

\* cited by examiner

NANOIMPRINT TEMPLATE WITH LIGHT BLOCKING MATERIAL AND METHOD OF FABRICATION

BACKGROUND

Field of Art

The present disclosure relates to systems and methods for limiting extrusion defects in a nanoimprint system.

Description of the Related Art

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate; therefore nano-fabrication becomes increasingly important. Nano-fabrication provides greater process control while allowing continued reduction of the minimum feature dimensions of the structures formed.

An exemplary nano-fabrication technique in use today is commonly referred to as nanoimprint lithography. Nanoimprint lithography is useful in a variety of applications including, for example, fabricating layers of integrated devices such as CMOS logic, microprocessors, NAND Flash memory, NOR Flash memory, DRAM memory, or other memory devices such as MRAM, 3D cross-point memory, Re-RAM, Fe-RAM, STT-RAM, and the like. Exemplary nanoimprint lithography processes are described in detail in numerous publications, such as U.S. Pat. Nos. 8,349,241, 8,066,930, and 6,936,194, all of which are hereby incorporated by reference herein.

A nanoimprint lithography technique disclosed in each of the aforementioned U.S. patents includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a solid layer that has a pattern conforming to a shape of the surface of the template that contacts the formable liquid. After solidification, the template is separated from the rigid layer such that the template and the substrate are spaced apart. The substrate and the solidified layer are then subjected to additional processes, such as etching processes, to transfer a relief image into the substrate that corresponds to the pattern in the solidified layer. The patterned substrate can be further subjected to known steps and processes for device fabrication, including, for example, oxidation, film formation, deposition, doping, planarization, etching, resist removal, dicing, bonding, and packaging, and the like.

When such imprint lithography techniques are practiced, particularly under high throughput conditions, there can be a tendency for the formable liquid to extrude beyond the intended patterning area. Such extruded liquid, if cured, can cause certain defects in subsequent imprint lithography processes. Therefore, there continues to be a need to minimize the formation of such extruded, cured material.

SUMMARY

In one aspect, a nanoimprint lithography template is provided that includes a body having first and second opposed sides, the second side having a mesa extending therefrom, with the mesa having sidewalls and a surface. A recessed shelf extends around a perimeter of the mesa surface, with a light-blocking material positioned on at least the recessed shelf and at a thickness such that the light-blocking material does not extend beyond a plane defined by the mesa surface.

In an embodiment, the light blocking material is chromium, molybdenum silicide, tungsten or tantalum.

In another embodiment, the recessed shelf has a depth of 20 nm to 1 mm.

In a particular embodiment, the recessed shelf extends from the mesa by a distance of 20 nm to 20 mm.

In a further embodiment, the light-blocking material is positioned on at least a portion of the mesa sidewalls.

In another embodiment, the light-blocking material is positioned on at least a portion of the second side of the template body.

In yet another embodiment, the recessed shelf defines a first recessed shelf and further and the template includes at least a second recessed shelf surrounding the first recessed shelf.

In a further embodiment, light-blocking material is positioned on the second recessed shelf at a thickness that does not extend beyond the mesa surface.

In another particular embodiment, the template includes a protective coating layer positioned over the light blocking material In another aspect, a method for fabricating a nanoimprint lithography template is provided. The method includes (i) providing a nanoimprint template substrate having a body having a first and second opposed sides, the second side having a mesa extending therefrom, the mesa having sidewalls and a surface, the surface having an interior region surrounded by a perimeter region; (ii) forming a mask layer on the interior region of the mesa surface; (iii) etching a recessed shelf into the perimeter region of the mesa surface using the mask layer as an etch mask; (iv) depositing a light blocking material on at least the recessed shelf at a thickness that is at or less than the depth of the recessed shelf; and (v) removing the mask layer, such that the light blocking material does not extend beyond a plane defined by the surface of the remaining interior region of the mesa surface.

In an embodiment, the deposited the light blocking material is chromium, molybdenum silicide, tungsten or tantalum In a particular embodiment, the light blocking material is deposited using electron beam evaporation, thermal evaporation, sputtering or ion beam deposition.

In another embodiment, the light blocking material is deposited on at least a portion of the mesa sidewalls.

In yet another embodiment, the light blocking material is deposited on at least a portion of the second side of the template body.

In a further embodiment, the etching step further comprises the steps of performing two or more etches such that the recessed shelf comprises a first recessed region and a second recessed region.

In another embodiment, the first etch of the two or more etches is a wet etch and a second etch of the two or more etches is a dry etch.

In an additional embodiment, the mask layer comprises two or more films of differing materials.

In yet a further embodiment, a protective coating is applied over the light blocking material.

In another aspect, a method of manufacturing an article is provided, the method including (i) positioning a formable material on a substrate; (ii) contacting the formable material with an imprint template, the imprint template having a body having first and second opposed sides, the second side having a mesa extending therefrom, the mesa having sidewalls and a surface; a recessed shelf extending around a perimeter of the mesa surface, and a light-blocking material positioned on at least the recessed shelf at a thickness such that the light-blocking material does not extend beyond a plane defined by the mesa surface; and (iii) applying actinic energy to cure the formable material.

In an embodiment, the light blocking material blocks the applied actinic energy to a dosage below that which would otherwise initiate curing of the formable material.

The details of one or more embodiments of the subject matter described in this specification are set forth in the accompanying drawings and the description below. Other potential features, aspects, and advantages of the subject matter will become apparent from the description, the drawings, and the claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

DETAILED DESCRIPTION

Figure 1:
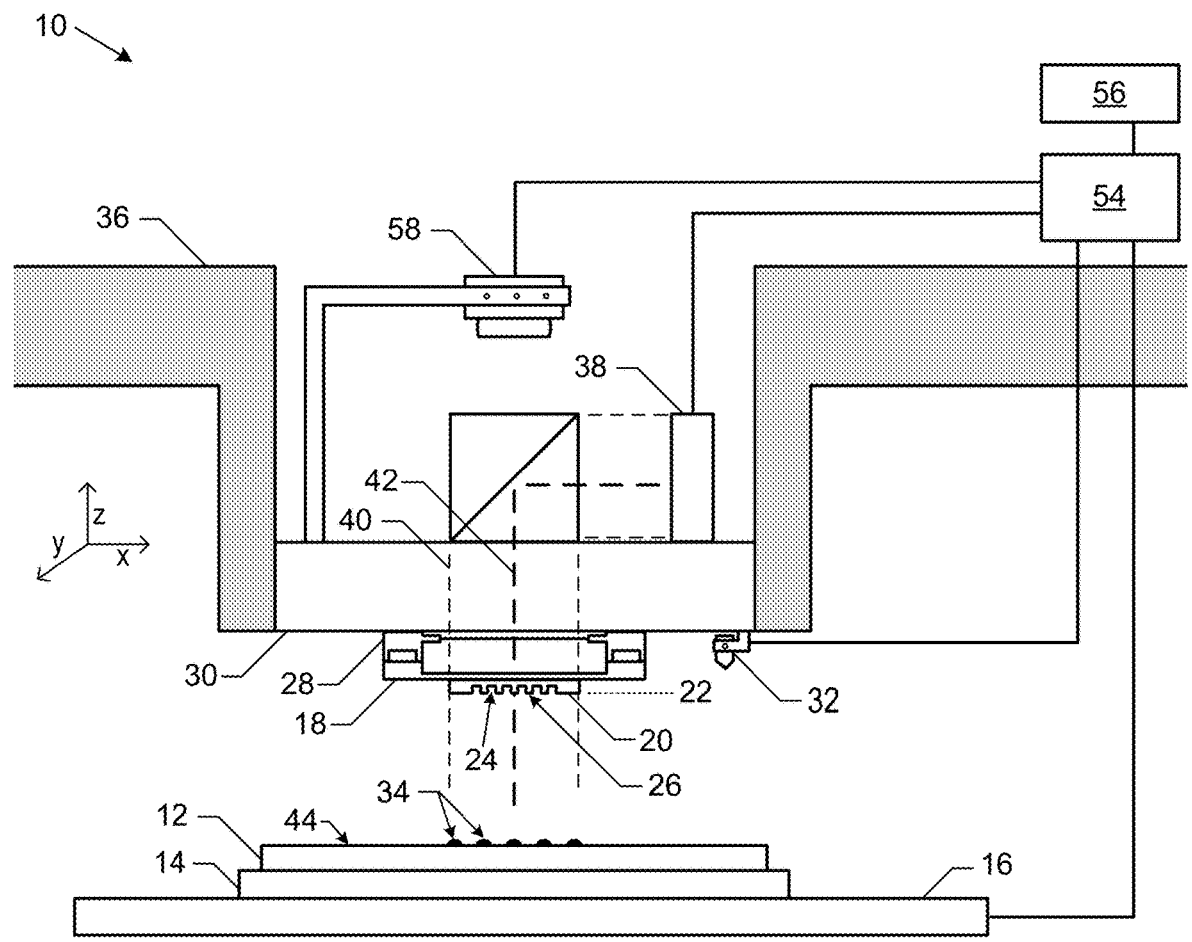
FIG. 1 illustrates a simplified side view of a nanoimprint lithography system having a template and a mold spaced apart from a substrate.

Referring to the figures, and particularly to FIG. 1, illustrated therein is nanoimprint lithography system 10 having a template 18 that is used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like. Exemplary chucks are described in U.S. Pat. No. 6,873,087, which is hereby incorporated by reference herein.

Substrate 12 and substrate chuck 14 may be further supported by stage 16. Stage 16 may provide translational and/or rotational motion along the x, y, and z-axes. Stage 16, substrate 12, and substrate chuck 14 may also be positioned on a base (not shown).

Spaced-apart from substrate 12 is template 18. Template 18 may include a body having a first side and a second side with one side having a mesa 20 extending therefrom towards substrate 12. Mesa 20 may have a patterning surface 22 thereon. Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations (e.g., planar surface). Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electrostatic, electromagnetic, and/or other similar chuck types. Further, chuck 28 may be coupled to imprint head 30 which in turn may be moveably coupled to bridge 36 such that chuck 28, imprint head 30 and template 18 are moveable in at least the z-axis direction.

Nanoimprint lithography system 10 may further comprise a fluid dispense system 32. Fluid dispense system 32 may be used to deposit formable material 34 (e.g., polymerizable material) on substrate 12. Formable material 34 may be positioned upon substrate 12 using techniques, such as, drop dispense, spin-coating, dip coating, chemical vapor deposition (CVD), physical vapor deposition (PVD), thin film deposition, thick film deposition, and/or the like. Formable material 34 may be disposed upon substrate 12 before and/or after a desired volume is defined between mold 22 and substrate 12 depending on design considerations. For example, formable material 34 may comprise a monomer mixture as described in U.S. Pat. Nos. 7,157,036 and 8,076,386, both of which are herein incorporated by reference.

Figure 2:
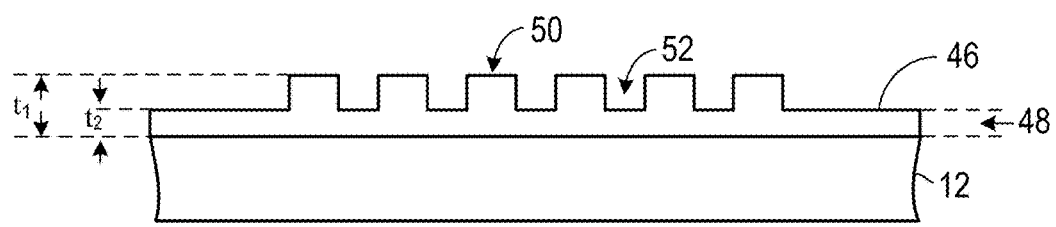
FIG. 2 illustrates a simplified view of the substrate illustrated in FIG. 1, having a solidified patterned layer formed thereon.

Referring to FIGS. 1 and 2, nanoimprint lithography system 10 may further comprise energy source 38 that directs energy 40 along path 42. Imprint head 30 and stage 16 may be configured to position template 18 and substrate 12 in superimposition with path 42. Camera 58 may likewise be positioned in superimposition with path 42. Nanoimprint lithography system 10 may be regulated by processor 54 in communication with stage 16, imprint head 30, fluid dispense system 32, source 38, and/or camera 58 and may operate on a computer readable program stored in memory 56.

Either imprint head 30, stage 16, or both vary a distance between mold 20 and substrate 12 to define a desired volume therebetween that is filled by formable material 34. For example, imprint head 30 may apply a force to template 18 such that mold 20 contacts formable material 34. After the desired volume is filled with formable material 34, source 38 produces energy 40, e.g., ultraviolet radiation, causing formable material 34 to solidify and/or cross-link conforming to a shape of surface 44 of substrate 12 and patterning surface 22, defining patterned layer 46 on substrate 12. Patterned layer 46 may comprise a residual layer 48 and a plurality of features shown as protrusions 50 and recessions 52, with protrusions 50 having a thickness $t_1$ and residual layer having a thickness $t_2$.

The above-mentioned system and process may be further employed in imprint lithography processes and systems referred to in U.S. Pat. Nos. 6,932,934, 7,077,992, 7,179,396, and 7,396,475, all of which are hereby incorporated by reference in their entirety.

Referring again to FIG. 1, a key feature of template 18 is mesa 20 which contains patterning surface 22. Mesa 20 can extend from the remaining template surface at a thickness range of anywhere between 5 microns and 500 microns, with a more typical value of 10-50 microns. Mesa 20, serves several purposes. First, it defines the area of the pattern that will be imprinted onto a substrate, such as a silicon semiconductor wafer. Second, the mesa height (or thickness) can prevent the remainder of the template from making contact with any part of the substrate being imprinted during an imprint process. Any contact between the template and the substrate surface outside of where the formable material 34 has been dispensed runs the risk of causing a defect on the substrate and/or damage to the template.

However, when such templates are used, in particular under high throughput conditions, there can be a tendency to form extrusions, defined as the formable material which extends (or extrudes) beyond the border of the mesa surface. Such extruded material can accumulate on the mesa sidewalls and subsequently solidify upon exposure to actinic radiation (e.g., ultraviolet light). During separation of the template from the substrate following the curing of the formable material, the extruded, cured material can remain on the substrate, creating a defect that negatively affects subsequent substrate processing. The extruded, cured material can also adhere to and remain on the mesa sidewall and, as the imprint process repeats on a field-by-field basis, additional cured, extruded material can accumulate on the mesa sidewall. Eventually, the accumulated material may break off from the mesa sidewall and deposit onto the substrate surface, thereby causing a defect on the substrate. Such unwanted deposition of the extruded material on the substrate can occur after a single imprint step or after repeated steps.

Another failure mechanism can occur whereby the cured, extruded material accumulation can build up on the mesa sidewall to a degree that the cured, extruded material extends beyond a plane defined by the mesa surface. This subsequently interferes with the positioning of the template relative to the substrate in following imprint steps. In such a case, the spreading and filling of the formable material is adversely impacted, and defects such as non-fill defects or undesirable residual layer thickness variations may occur.

As a result, it is advantageous to develop processes that are capable of preventing or at least minimizing the deposition of cured, extruded material on the substrate and/or the accumulation of cured, extruded material on the sidewall of the mesa. One such approach involves applying a light-blocking coating to the front surface and sidewalls of the template, such that any extruded material is not exposed to curing light energy. This can be done, for example, by applying a photomask to the mesa surface so as to protect the patterning area, followed by applying a light blocking material onto the unmasked mesa sidewalls and template front surface. The mask can then be removed using e.g. a "lift off" method. Alternatively, the mask can be applied during initial template formation. For example, the photomask can be applied to a template substrate at the desired mesa area, followed by a wet etch to create the mesa itself. Then again, prior to removing the mask, a light blocking material is coated onto the unmasked template surface and mesa sidewalls, followed by a lift off process.

The disadvantages of such approaches are two-fold. First, the application of a photo mask onto a previously-formed mesa is imprecise. That is, using conventional techniques, a photomask can be located on the mesa to at best within 1 micron (+/−1 μm) accuracy. So if the mask is not precisely located even with the mesa edge, it can result in the deposition of light blocking material on the mesa surface itself, thereby impacting the usability of the resultant template. More specifically, if the light blocking material is deposited onto, and extends upward above, the rest of the mesa surface, then control of residual layer thickness is compromised when the resultant template is used during a nanoimprint process. Even an extension of only a few nanometers of material above the mesa surface creates a problem, as residual layer thicknesses are careful chosen to assure uniform pattern transfer after a nanoimprint process. In addition, the deposited light blocking material itself has the potential to break off from the mesa surface during use, creating an unwanted defect on the substrate. The approach of masking the mesa area during the initial mesa formation can solve the above problem, but in turn creates a different problem. That is, while this second approach ensures that the mesa surface remains fully masked such that no light blocking material can be deposited onto the mesa surface, the wet etch step creates an undercut below the photomask. Due to this undercut, it then becomes difficult to apply a sufficient amount of light-blocking material onto the formed mesa sidewalls to adequately block curing light. Substituting a dry etch step for the wet etch can reduce undercut formation, but still ultimately suffers from a similar problem. That is, even with a direct etch, it is difficult to precisely control the light blocking material deposition process to provide adequate sidewall coverage without also creating unwanted material build-up adjacent to and above the mesa surface.

What is needed therefore is an imprint template and a method for forming the same that provides a sufficient thickness of light blocking material at or near the mesa sidewall but without such material accumulating on or extending beyond the mesa surface. To such end, provided herein are templates and methods for forming the same that meet such needs and that, among other advantages, prevent or at least minimize the accumulation of cured, extruded resist on the mesa sidewall when used.

Figure 3A:
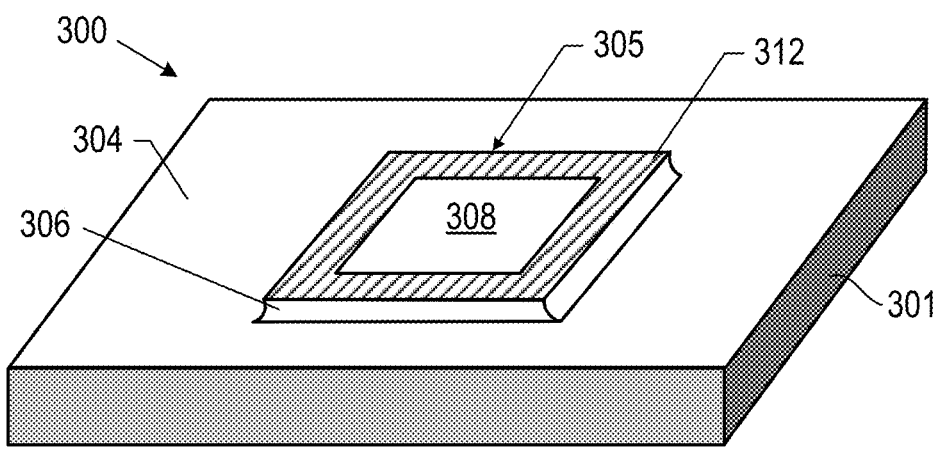
FIGS. 3A-3C illustrate perspective, top and cross sectional views of a template according to an embodiment of the invention.
Figure 3B:
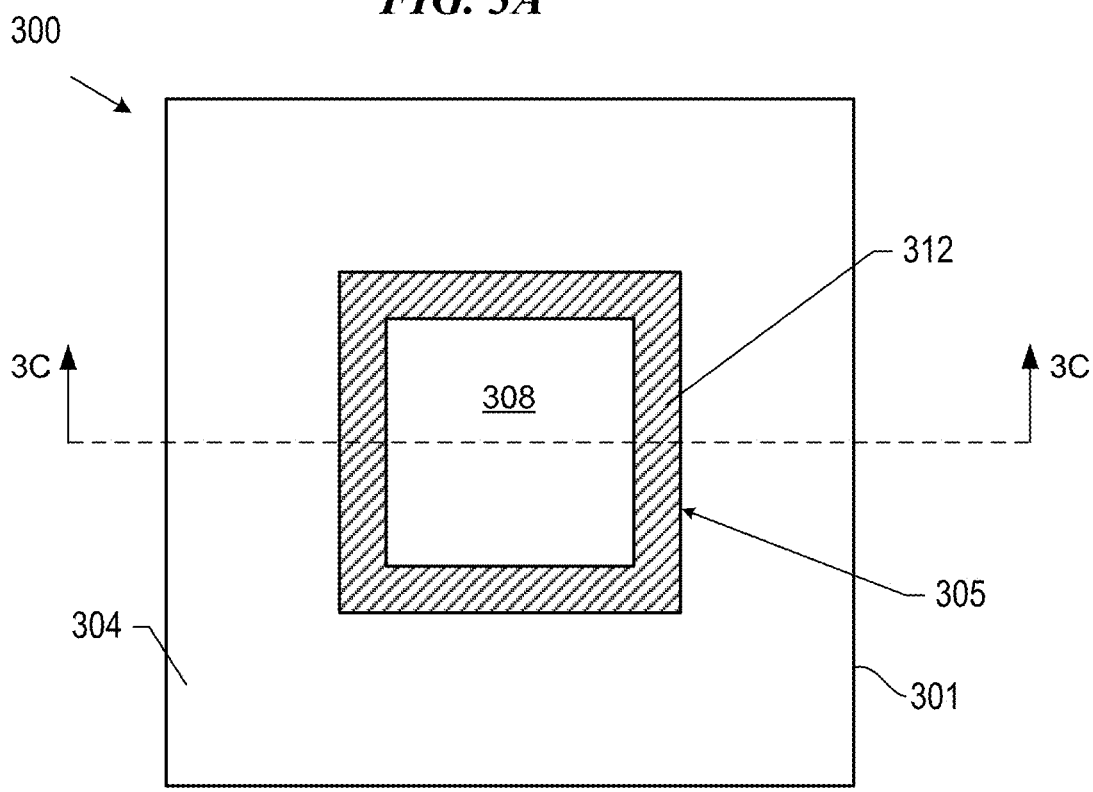
Figure 3C:
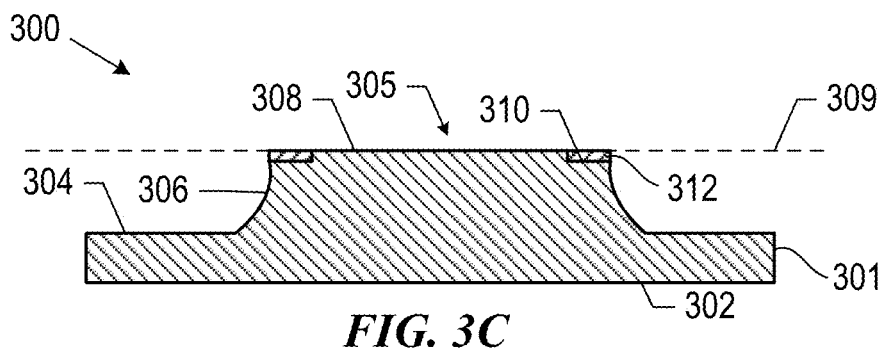

FIGS. 3A-3C depict a first embodiment. Template 300 includes template body 301 with opposing first (or back) side 302 and second (or front) side 304. Mesa 305 extends from front side 304 and terminates in mesa surface 308, with sidewall 306 defined between mesa surface 308 and front side 304. Template 300 further includes recessed shelf 310 extending around the perimeter of, and at a depth below, mesa surface 308. Light blocking material 312 covers shelf 310 at a thickness extending up to but not beyond plane 309 defined by mesa surface 308, which if otherwise would disrupt other aspects of the imprint process, including e.g. residual layer thickness uniformity, etc. Here, the perimeter width of recessed shelf 310 and corresponding light blocking material 312 is configured such that it is sufficient to minimize curing of a formable material extruding beyond mesa surface 308. For example, in the semiconductor industry, a standard area for a single field imprint is typically on the order of 26 mm×33 mm (in the x and y directions, respectively). In such a case, mesa surface 308 can be sized correspondingly, with the perimeter width of recessed shelf 310 and corresponding light blocking material 312 ranging from, e.g., 20 nm to 20 mm, or 10 nm to 10 mm, or 1 micron to 1 millimeter. In certain applications, the width can be 100-1000 μm. In variations, further light blocking material can be applied to mesa sidewalls 306 and, optionally, to front surface 304.

Figure 4A:
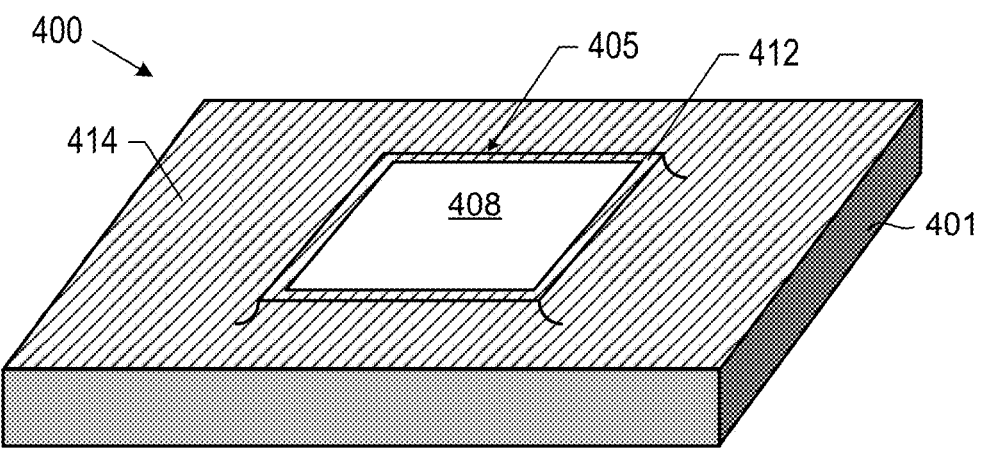
FIGS. 4A-C illustrate perspective, top and cross sectional views of a template according to another embodiment of the invention.
Figure 4B:
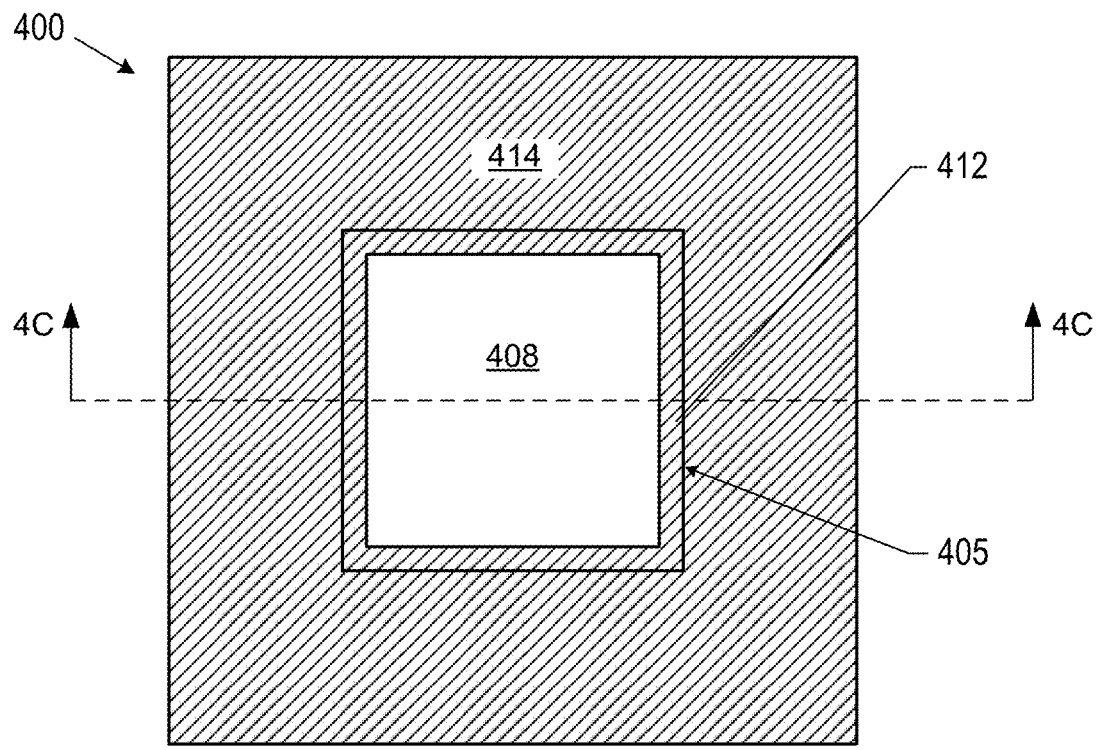
Figure 4C:
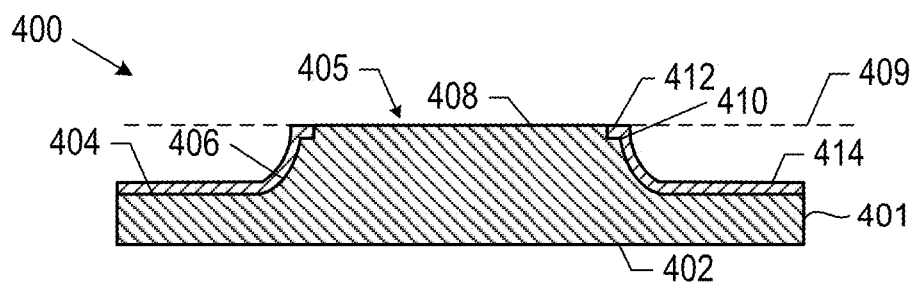

A second embodiment is depicted in FIGS. 4A-4C. Like template 300, template 400 similarly includes template body 401 having opposed back side 402 and front side 404, with mesa 405 extending from front side 404 and terminating in mesa surface 408, with sidewall 406 defined between mesa surface 408 and front surface 404. Template 400 further includes recessed shelf 410 extending around the perimeter and at a depth below mesa surface 408. Here, light blocking material 412 covers front side 404, sidewall 406, and recessed shelf 410. Again, light blocking material 412 can be at a thickness such that it can extend up to but not beyond plane 409 defined by mesa surface 408. Again, the provision of recessed shelf 410 allows for light blocking material 412 to be provided at adequate working thicknesses at both mesa sidewall 406 and surrounding mesa surface 408 in order to minimize curing of extruded imprint material, but without having the light blocking material extend beyond plane 409 defined by mesa surface 408. In addition, the provision of light blocking material 412 on sidewall 406 can allow for a relatively narrower width of recessed shelf 410 as compared to recessed shelf 310 of template 300 of FIGS. 3A-3C, while still achieving the desired overall light blocking effect. In certain applications, the width can be 1-5 μm. This may be advantageous in certain step-and-repeat imprint processes so as to avoid the risk of the recessed shelf portion of the template contacting and potentially damaging features of an adjacent, previously imprinted field.

Turning to FIG. 5A-5E, a method of forming template 400 is depicted. In a first step, template substrate 401 is provided having first and second opposed sides 402 and 404, with mesa 405 extending from side 404 and terminating in mesa surface 407. Mesa surface 407 is configured such that its surface area is larger than the desired mesa surface area of the final resultant template. For example, for a 26 mm×33 mm field size, mesa surface 407 can be formed as oversized by 20 nm to 20 mm, or 10 nm to 10 mm, or 1 micron to 1 millimeter relative to a final desired mesa surface size of 26 mm×33 mm. Mesa surface 407 can be provided with the desired device pattern features already formed into the mesa surface prior to adding the light blocking material, or alternatively, such features can be patterned into the mesa surface later.

Figure 5A:
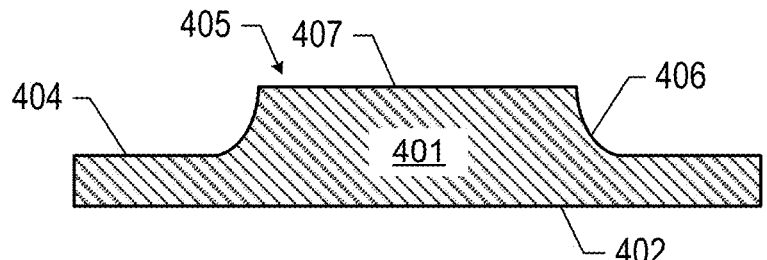
FIGS. 5A-5E illustrate a process for fabricating a template according to an embodiment of the invention.
Figure 5B:
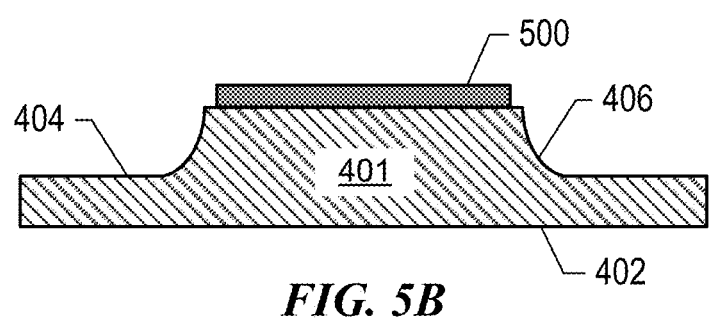

Next, as further depicted in FIG. 5B, mask layer 500 is then formed on mesa surface 407, leaving a protected interior region surrounded by an exposed outer region of the mesa surface. This can be achieved by various lithographic methods. As one example, a masking material, e.g. a photoresist, is deposited on the mesa surface and then the resist is exposed in a pattern which has the approximate dimensions of the final desired mesa surface size. Such a photoresist can be applied e.g. with a spin-on or capillary coating process, and then baked in order to drive off solvents. The final desired mesa surface area size is then exposed in the resist using e.g. a laser scanning exposure tool. After exposure, the resist is developed to form the final desired mesa size. Other methods for forming the desired mesa surface area size can include the use of a contact or proximity aligner, an electron beam exposure system, or a nanoimprint system. Useful resist materials can be both positive tone (resist is removed during the resist development process where the resist has been exposed) and negative tone (resist remains during the resist development process where the resist has been exposed). The thickness of the resist layer can range from 20 nm to 20 microns, with a more typical range of 100 nm to five microns.

Additionally, masking layer 500 may be formed as a stack comprising one or more materials. For example, multiple materials can be employed in order to create either a vertical or undercut profile. Such profiles are advantageous in order to avoid later applied light blocking material from covering up the side edges of masking layer 500, and impeding the later lift-off step. Two or more materials can be used as a resist stack to achieve the desired material profile. For example, one such resist stack can consist of a bottom layer of polydimethylglutarimide (PMGI), with an intermediate layer of a thin oxide, nitride or metal film, and a top layer of an imaging resist. The imaging resist can be used as an etch mask to pattern transfer into the intermediate layer, with the intermediate layer then acting as a hard mask for etching the bottom PMGI layer. An undercut can be achieved in the final etch into the PMGI layer by either using a wet etchant or a dry etch process at elevated pressures.

Figure 5C:
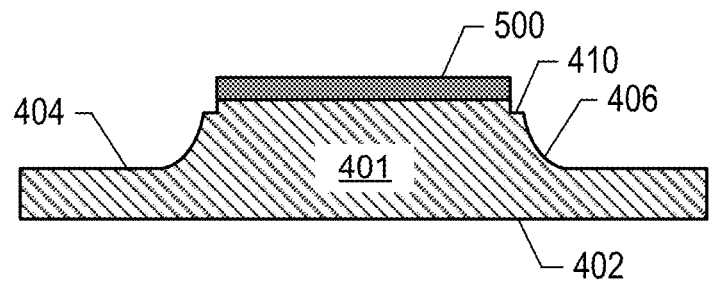

Turning to FIG. 5C, mask layer 500 is then used as an etch mask to etch into the exposed perimeter region of mesa 405, thereby forming recessed step or shelf 410 extending around the perimeter of original mesa surface 407, and yielding final mesa surface area 408. For example, a dry etch, such as a reactive ion etch is used to form recessed shelf 410. The reactive ion etch process is typically anisotropic, thereby forming a vertical, near vertical, or retrograde sidewall. Other dry reactive etch processes can be employed as well, such as inductive coupled plasma etches and electron cyclotron resonance etches. Gases that can be used as an etchant include fluorine containing gases such as, $CHF_3$, $CF_4$, $C_4F_8$, $SF_6$, as well as combinations of these gases. Etch assist gases such as oxygen, hydrogen, argon and helium, can also be combined with the fluorine based chemistries. Alternatively, a wet etch can be used to create recessed shelf 410. Although a wet etch is typically isotropic, if the amount of template substrate material that is etched is small enough to still provide for deposition of the minimal amount of light blocking material required, then a wet etch can be an adequate approach, despite its non-directionality. A typical wet etchant for fused silica template material is buffered oxide etch (BOE).

The depth of recessed shelf 410 is ideally at least as deep as the thickness of the light blocking material needed to substantially block all or most of the curing light applied in the desired imprint application. The light blockage need not be 100%, however, since any imprint resist material has an exposure dose threshold that is necessary before any of the resist is cured. That is, an effective light blockage can be that which results in a dosage below that which would otherwise initiate curing of the formable material. As an example, a resist may require more than 20% of the required exposure dose to initiate curing. As a result, an effective amount of light blocking material in such scenario would be that which blocks at least 80% of the incoming light, i.e., enough to avoid initiating curing. As an example, if chromium is used as the actinic light blocking material, in most applications as little as 20 nm can be used to effectively block or reflect the actinic light of the nanoimprint system. Therefore, the range in depth of the recessed shelf can be anywhere from 20 nm to 1 mm, with a more typical range of 25 nm to 10 microns.

Figure 5D:
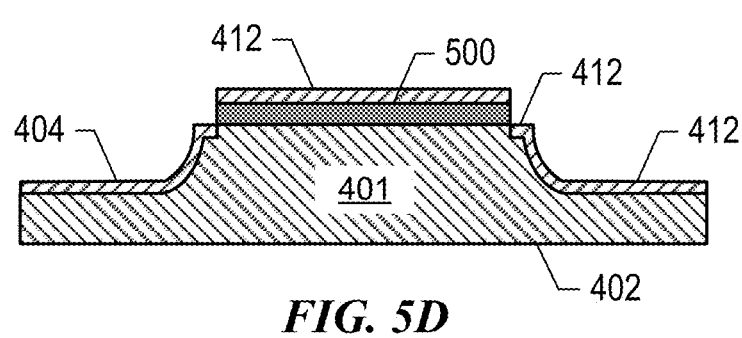

With reference to FIG. 5D, light blocking material 412 is then deposited on top of top of mask layer 500, recessed shelf 410, sidewall 406 and, optionally, front side 404. In certain applications, the light blocking material can be deposited using uniform deposition methods, so as to achieve a uniform thickness of the light blocking material on both the recessed shelf 410 and sidewall 406. Exemplary light blocking materials include chromium, molybdenum silicide, tungsten, tantalum and the like. The selected material is applied at a suitable thickness that absorbs or reflects a sufficient amount of light to avoid the curing of the formable material. The light blocking material may also be a multilayer such as e.g. alternating layers of a metal oxide and silicon dioxide. Useful metal oxides include titanium dioxide and tantalum oxide. Additionally, the properties of the light blocking material can be enhanced through the deposition of an additional thin film used to protect the light blocking layer from wet cleans that are performed to routinely clean the formed template. An example of such a protectant film is silicon dioxide.

Figure 5E:
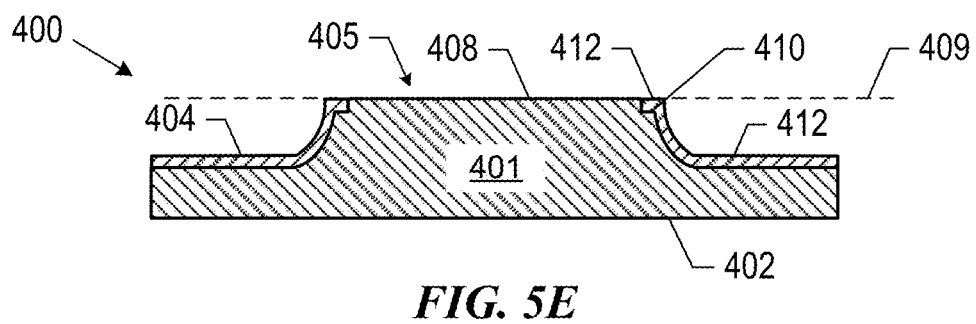

In the final step, as shown in FIG. 5E, mask layer 500 is removed using, e.g. a lift-off process to dissolve the mask material, thereby leaving blocking material 412 on recessed shelf 410 below or flush with plane 409 defined by mesa surface 408. Remaining light blocking material 412 remains on side wall 406 and front side 404. A lift-off step can typically be accomplished using acetone as a solvent, although other solvents are possible. If a positive resist is used, the resist can also be exposed to an actinic light source and then be dissolved with a base material such as tetramethyl ammonium hydroxide (TMAH). If PMGI is used, it can be dissolved away using 1-methyl-2-Pyrrolidinone (NMP) or other strong solvents.

Referring back to FIGS. 4A-4C, it can be seen that light blocking material 412 extends from mesa 405 out to the edges of the template. In other variations, light blocking material 412 can be limited to just those areas in which curing light would otherwise be expected to reach and cure extruded material. The light blocking material therefore can extend from the template mesa in the range of 10 microns from the mesa edge to all the way to the edge of the template, with a more typical extension of 1 mm from the mesa edge to within 10 mm of the edge of the template.

Figure 6A:
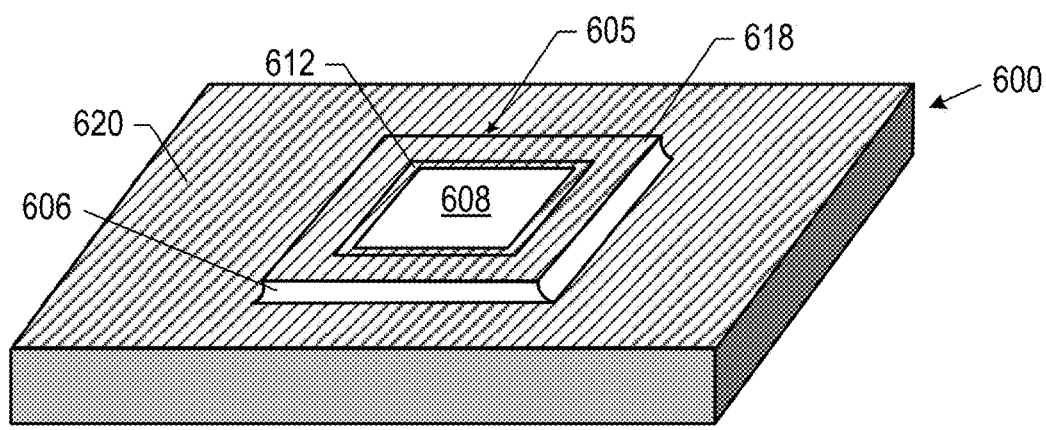
FIGS. 6A-6C illustrate perspective, top and cross sectional views of a template according to yet another embodiment of the invention.
Figure 6B:
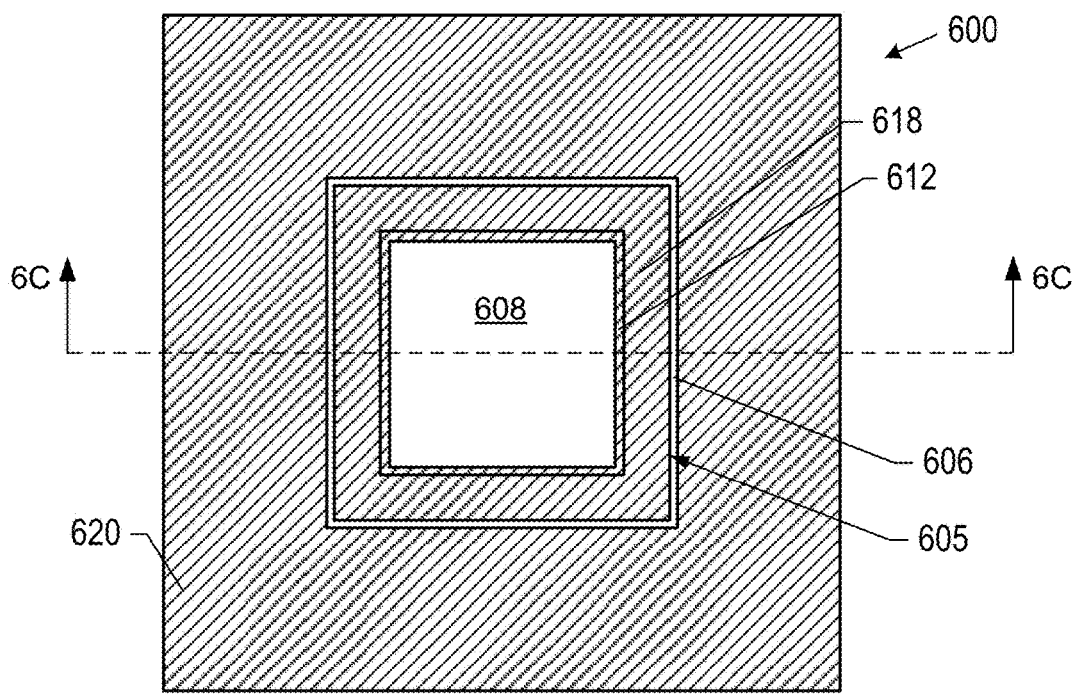
Figure 6C:
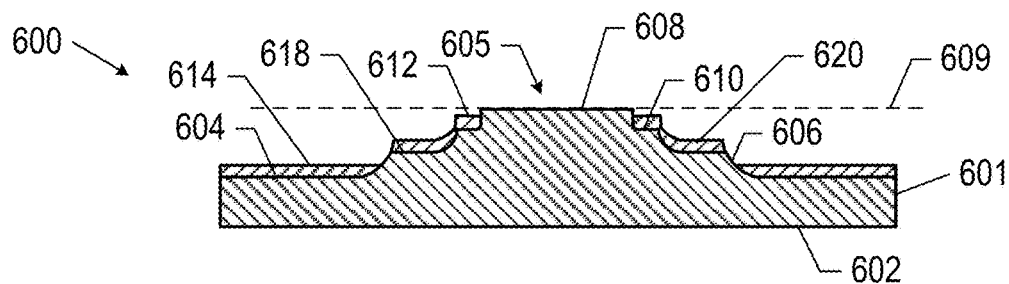

A third embodiment of a template according to the invention is depicted in FIGS. 6A-6C. Here, template 600 again includes template body 601 having opposed back side 602 and front side 604. Mesa 605 extends from front side 604, terminating in mesa surface 608, with sidewall 606 defined between mesa surface 608 and front surface 604. Template 600 further includes first recessed shelf 610 extending around the perimeter at a depth below mesa surface 608, with second recessed shelf 618 surrounding first recessed shelf 610 at an even lower depth. Light blocking material 612, 620, and 614, is positioned on first recessed shelf 610, second recessed shelf 618, and front side 604, respectively. Again, light blocking material 612 can be at a thickness such that it can extend up to but not beyond plane 609 defined by mesa surface 608. Here, the addition of second recessed shelf 618 can obviate the need to provide light blocking material on sidewall 606. That is, the second recessed shelf 618 and corresponding light blocking material 620 is of a sufficient width that it effectively blocks actinic energy from curing extruded formable material. At the same time, since second recessed shelf is positioned at a greater depth relative to mesa surface 608, it does not risk contacting and potentially damaging features of an adjacent, previously imprinted field when in use. In certain applications, the width of first recessed shelf 610 can be 1-5 μm and the width of second recessed shelf 618 can be 100-1000 μm. The depth of first and second recessed shelves 610 and 618 can range from 20 nm to 1 mm, with a more typical range of 25 nm to 10 microns. As detailed further below, for fabrication purposes it is preferable that second recessed shelf 618 have a shallower depth relative to first recessed shelf 610.

Figure 7A:
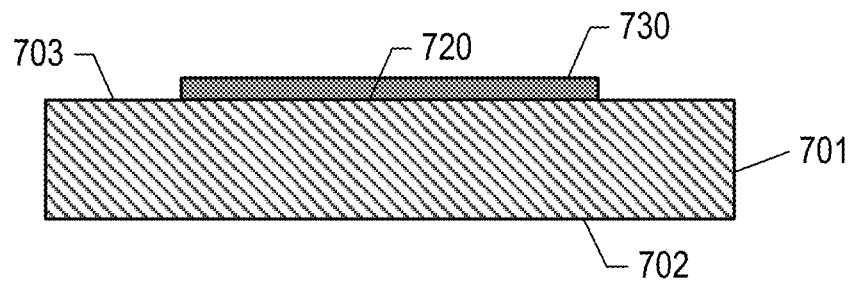
FIGS. 7A-7F illustrate a process for fabricating a template according to a further embodiment of the invention.
Figure 7B:
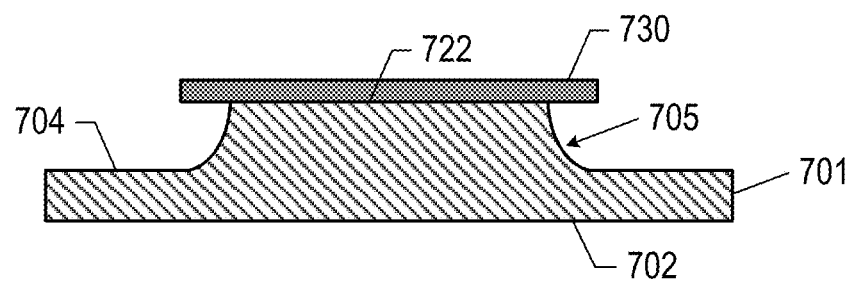
Figure 7C:
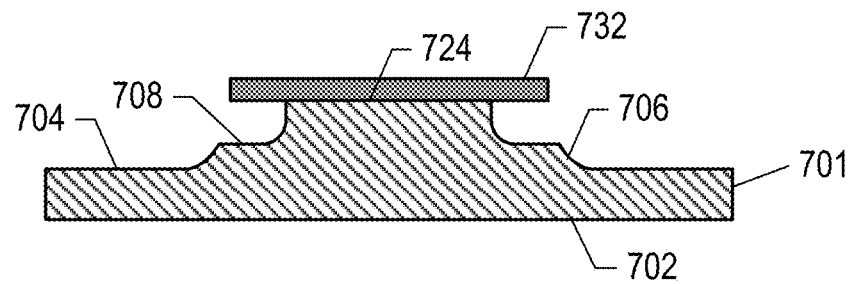
Figure 7D:
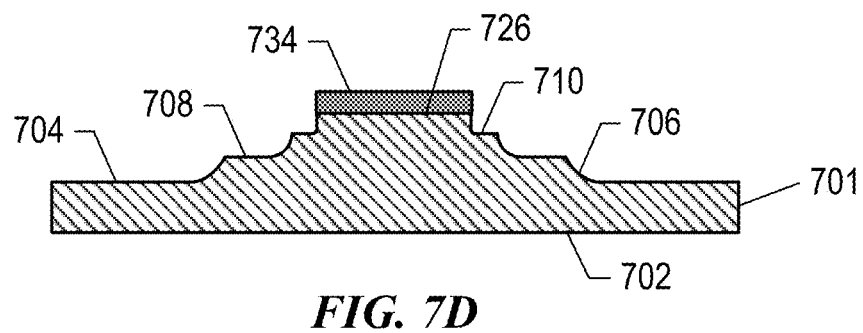
Figure 7E:
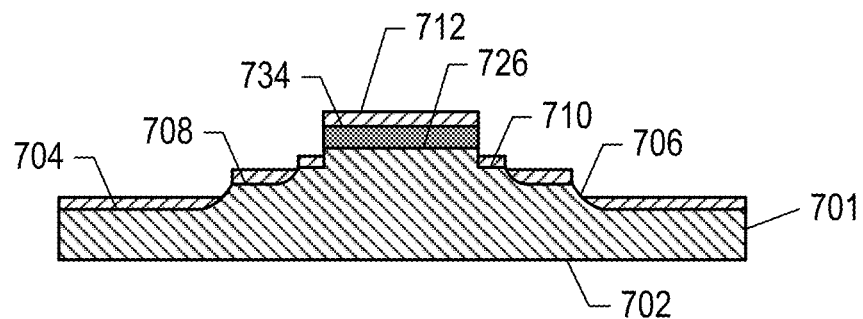
Figure 7F:
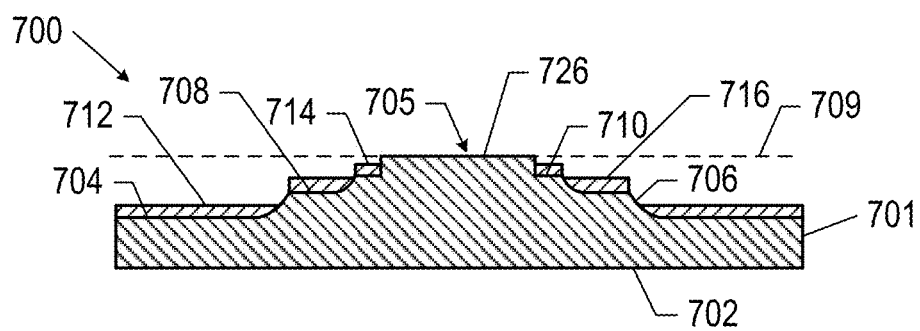

Turning to FIGS. 7A-7F, a method of fabricating a template similar to that of template 600 is depicted. With reference to FIG. 7A, in a first step, template substrate 701 is provided having backside 702 and opposing side 703 that contains region 720 protected by mask layer 730. In FIG. 7B, a wet etch step is performed using mask layer 730 as a protective mask to create an undercut beneath mask layer 730. This step yields front side 704 with mesa 705 extending therefrom, with mesa 705 terminating in first mesa surface 722. Again, first mesa surface 722 is configured such that its surface area is larger than the desired final mesa surface area of the resultant template. A second mask layer 732 is then formed on first mesa surface 722, again using e.g. a photolithographic step, followed by a second wet etch (FIG. 7C). This results in the formation of recessed shelf 708 surrounding resultant second mesa surface 724, and similarly results in second mesa surface 724 being reduced in surface area as compared with prior first mesa surface 722. Sidewall 706 is defined between shelf 708 and front side 704. A third mask layer 734 is then formed on second mesa surface 724, again using e.g. a photolithographic step, and followed in this instance by e.g. a dry etch (FIG. 7D). This results in the formation of shelf 710 surrounding resultant third mesa surface 726. Shelf 710, in turn, is surrounded by previously formed shelf 708. Resultant third mesa surface 726 has similarly been further reduced in surface area as compared to previous second mesa surface 724, and is now at the desired final surface area for the resultant template. In the next step (FIG. 7E), light blocking material is directionally applied to mask layer 734 and to shelfs 710 and 708, resulting in light blocking material 712, 714 and 716 being deposited onto mask layer 734, recessed shelf 710 and recessed shelf 708, respectively. The light blocking material can be deposited using directional deposition techniques. That is, the deposited material is deposited normal to the surface of mask layer 734 (and likewise normal to underlying mesa surface 408). Exemplary directional deposition methods include electron beam deposition, thermal evaporation, collimated sputtering, and ion beam deposition. Following this, a lift-off process is used to dissolve mask layer 734, yielding final template 700 (FIG. 7F). Template 700 thus has blocking material 714 positioned on recessed shelf 710, which is below or flush with plane 709 defined by final mesa surface 726, as well as light blocking material 716 positioned on surrounding shelf 708. It is advantageous that recessed shelf 708 have a shallower depth relative to recessed shelf 710 and to the thickness of the later applied light blocking material, such that when the light blocking material is directionally applied, the top of light blocking material 716 is positioned at or higher than recessed shelf 710, such that there is a continuous extension of light blocking material extending across both recessed shelves 710 and 708. Light blocking material 712 optionally can be positioned on front surface 704.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A nanoimprint template comprising:
a body having first and second opposed sides, the second side having a mesa extending therefrom, the mesa having sidewalls and a surface, the surface having a pattern feature comprising a protrusion that extends from the surface;
a shelf recessed from the surface having the pattern feature and positioned between the sidewalls and the surface having the pattern feature, the shelf extending around a perimeter of the surface having the pattern feature; and
a light-blocking material positioned on the shelf at a thickness such that a top surface of the light-blocking material does not extend beyond the surface having the pattern feature.

2. The nanoimprint template of claim 1 wherein the light blocking material is chromium, molybdenum silicide, tungsten or tantalum.

3. The nanoimprint template of claim 1 wherein the shelf has a depth of 20 nm to 1 mm.

4. The nanoimprint template of claim 1 wherein the shelf extends from the mesa by a distance of 20 nm to 20 mm.

5. The nanoim print template of claim 1 further comprising light-blocking material positioned on at least a portion of the mesa sidewalls.

6. The nanoimprint template of claim 1 further comprising light-blocking material positioned on at least a portion of the second side of the template body.

7. The nanoimprint template of claim 1 wherein the shelf recessed from the surface defines a first shelf and further comprising a second shelf surrounding the first shelf and positioned between a plane defined by the mesa surface and a plane defined by the second side of the template.

8. The nanoimprint template of claim 7 wherein the light-blocking material is positioned on the second recessed shelf at a thickness that does not extend beyond the mesa surface.

9. The nanoimprint template of claim 1 further comprising a protective coating layer positioned on the light blocking material.

10. The nanoimprint template of claim 1, further comprising:
a second light-blocking material provided on at least a part of the sidewalls of the mesa.

11. The nanoimprint template of claim 7, wherein the second shelf is at a lower depth below the plane defined by the mesa surface relative to the first shelf.

* * * * *